United States Patent
Kadkol

(10) Patent No.: US 9,455,713 B1
(45) Date of Patent: Sep. 27, 2016

(54) SPLIT RESISTOR SOURCE-SERIES TERMINATED DRIVER

(71) Applicant: Avago Technologies General IP (Singapore) Pte. Ltd., Singapore (SG)

(72) Inventor: Aniket Kadkol, Cupertino, CA (US)

(73) Assignee: Avago Tcehnologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/728,270

(22) Filed: Jun. 2, 2015

(51) Int. Cl.
*H04L 27/00* (2006.01)
*H03K 19/0185* (2006.01)
*H04L 1/00* (2006.01)

(52) U.S. Cl.
CPC ..... *H03K 19/018514* (2013.01); *H04L 1/0033* (2013.01)

(58) Field of Classification Search
CPC ........... H04L 25/0272; H04L 25/0278; H04L 25/028; H03M 9/00
USPC .......................................................... 375/295
See application file for complete search history.

(56) References Cited

U.S. PATENT DOCUMENTS

| | | | |
|---|---|---|---|
| 6,794,900 B2 | 9/2004 | Tang et al. | |
| 7,078,943 B2 | 7/2006 | Ho et al. | |
| 8,520,348 B2 | 8/2013 | Dong | |
| 8,854,108 B1 | 10/2014 | Suzuki | |
| 2007/0096720 A1* | 5/2007 | Clements | G01R 35/007 324/601 |
| 2013/0163126 A1* | 6/2013 | Dong | G06F 13/4086 361/56 |
| 2014/0368272 A1 | 12/2014 | Wang et al. | |

\* cited by examiner

*Primary Examiner* — David S Huang

(57) ABSTRACT

A Serializer/Deserializer (SerDes) is described with improved transmitter driver architecture. The transmitter driver architecture consumes significantly less power than other transmitter driver architectures as most of the circuits are driven by a low power supply. Furthermore, there is no need for level shifting even though the transmitter driver architecture is capable of supporting over as 1V of differential peak-to-peak voltage across the communication channel.

20 Claims, 7 Drawing Sheets

SPLIT RESISTOR SOURCE-SERIES TERMINATED DRIVER

FIELD OF THE DISCLOSURE

The present disclosure is generally directed toward data communication and, in particular, toward drivers for serializers.

BACKGROUND

Serializer/Deserializers (Ser/Des) are devices that can take wide bit-width, single-ended signal buses and compress them to a few, and often times one, differential signal that switches at a much higher frequency rate than the wide single-ended data bus. A SerDes is often used in high-speed communication networks and is typically an Integrated Circuit (IC) transceiver. In other words, the SerDes provides the interface between a core of an IC or similar processor core and the communication channel used to carry information to/from the core of the IC or processor.

SerDes applications with higher data rates are trying to strive for better power efficiency (mW/Gbps). Meanwhile, some applications and standards require the transmitter output to be as high as 1.2V (differential peak-to-peak). There are some problems with using a conventional voltage mode driver for providing as high as 1.2V differential swings at the output, including: (1) reliability concerns (oxide breakdown in case of thin oxide devices); (2) higher power consumption due to the transmission circuits using a 1.2V supply when not needing it; and (3) level shifters are needed to raise the signal domain from a lower supply that the Serializers and other preceding circuits use.

BRIEF DESCRIPTION OF THE DRAWINGS

The present disclosure is described in conjunction with the appended figures, which are not necessarily drawn to scale.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

While embodiments of the present disclosure will be described in connection with a transmitter of a serialized data stream that serializes data that was previously parallelized, it should be appreciated that embodiments of the present disclosure are not so limited. In particular, while the particular type of low-level circuit or circuit components described herein (e.g., a Serializer/Deserializer (SerDes)) is capable of accelerating and serializing data, it should be appreciated that any type of Integrated Circuit (IC), IC chip, IC chip component, audio/video signal processing, telephone system, etc. can utilize circuitry and/or systems described herein.

Figure 1:
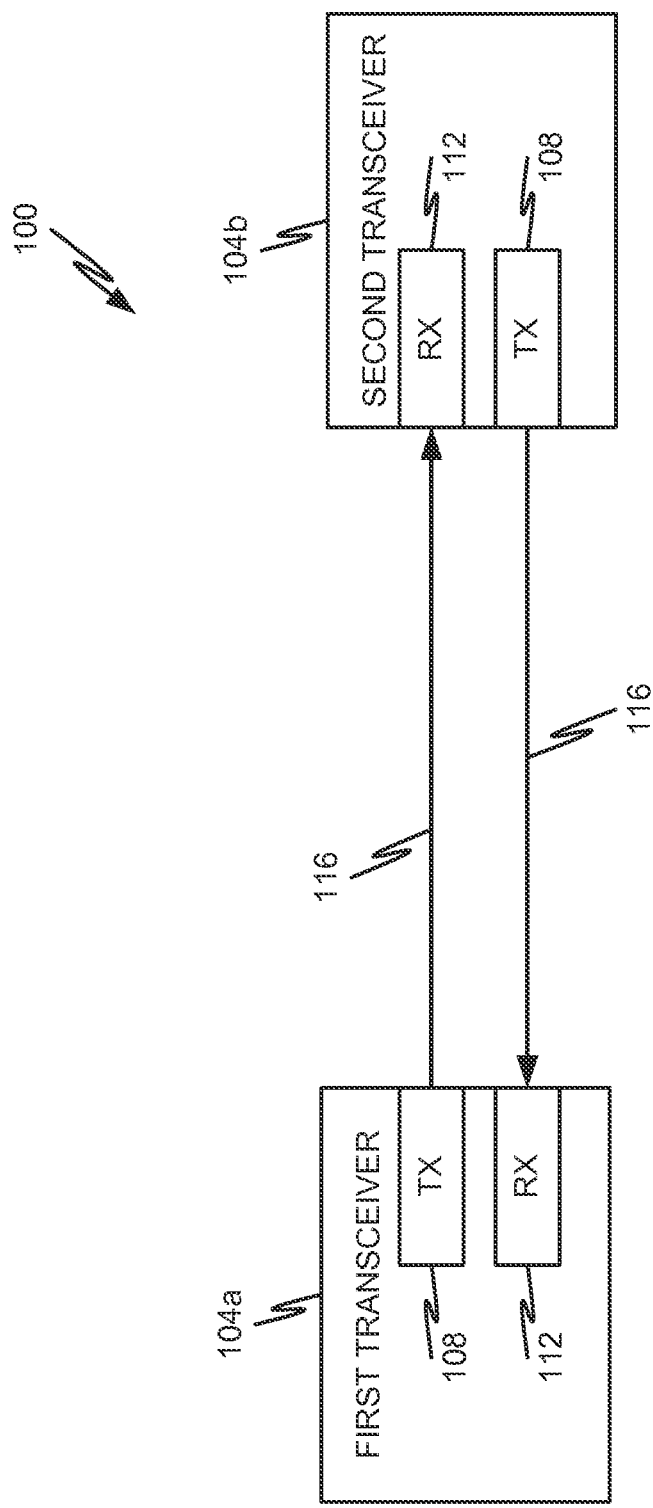
FIG. 1 is a block diagram depicting a communication system in accordance with embodiments of the present disclosure.

Referring now to FIG. 1, a communication system 100 will be described in accordance with at least some embodiments of the present disclosure. The system 100 is shown to include one or more transceivers 104a, 104b, each having a transmitter 108 and a receiver 112. The transceivers 104a, 104b are shown to communicate with one another via one or more communication channels 116 that connect a transmitter 108 with a receiver 112. It should be appreciated that embodiments of the present disclosure may also be implemented in a communication system having dedicated transmitters 108 and receivers 112 instead of a combination of a transmitter 108 and receiver 112 being implemented in a transceiver 104.

In some embodiments, the communication channel 116 may carry an analog signal that is modulated according to any type of known modulation technique, such as Amplitude Modulation, Pulse Amplitude Modulation, Non-Return to Zero Modulation, Double-Sideband Modulation, Vestigal Sideband Modulation, Quadrature Amplitude Modulation, Frequency Modulation, Phase Modulation, combinations thereof, or the like. The communication channel 116 may include a wired communication medium (e.g., a physical wire, coaxial cable, fiber-optics, etc.), a wireless communication medium (e.g., air), or a combination of wired and wireless media. It should be appreciated that the transmitter 108 may be configured to first receive a digital signal as an input (e.g., from a digital circuit or digital circuit components, such as an IC or IC component or processor core) and then convert the digital signal into an analog signal for transmission across the communication channel 116. The receiver 112 may be configured to receive the analog signal from the communication channel 116 and convert the analog signal back into a digital signal for processing by a digital circuit or processor core that is connected to an output of the receiver 112. It should be appreciated that the communication channel 116 may traverse long or short distances. For instance, the communication channel 116 may correspond to a short interconnection between components on an IC chip. In some embodiments, the communication channel 116 may correspond to a SerDes channel. As another example, the communication channel 116 may correspond to a long interconnection (e.g., on the order of miles) between a transmitting station and a receiving station.

Figure 2:
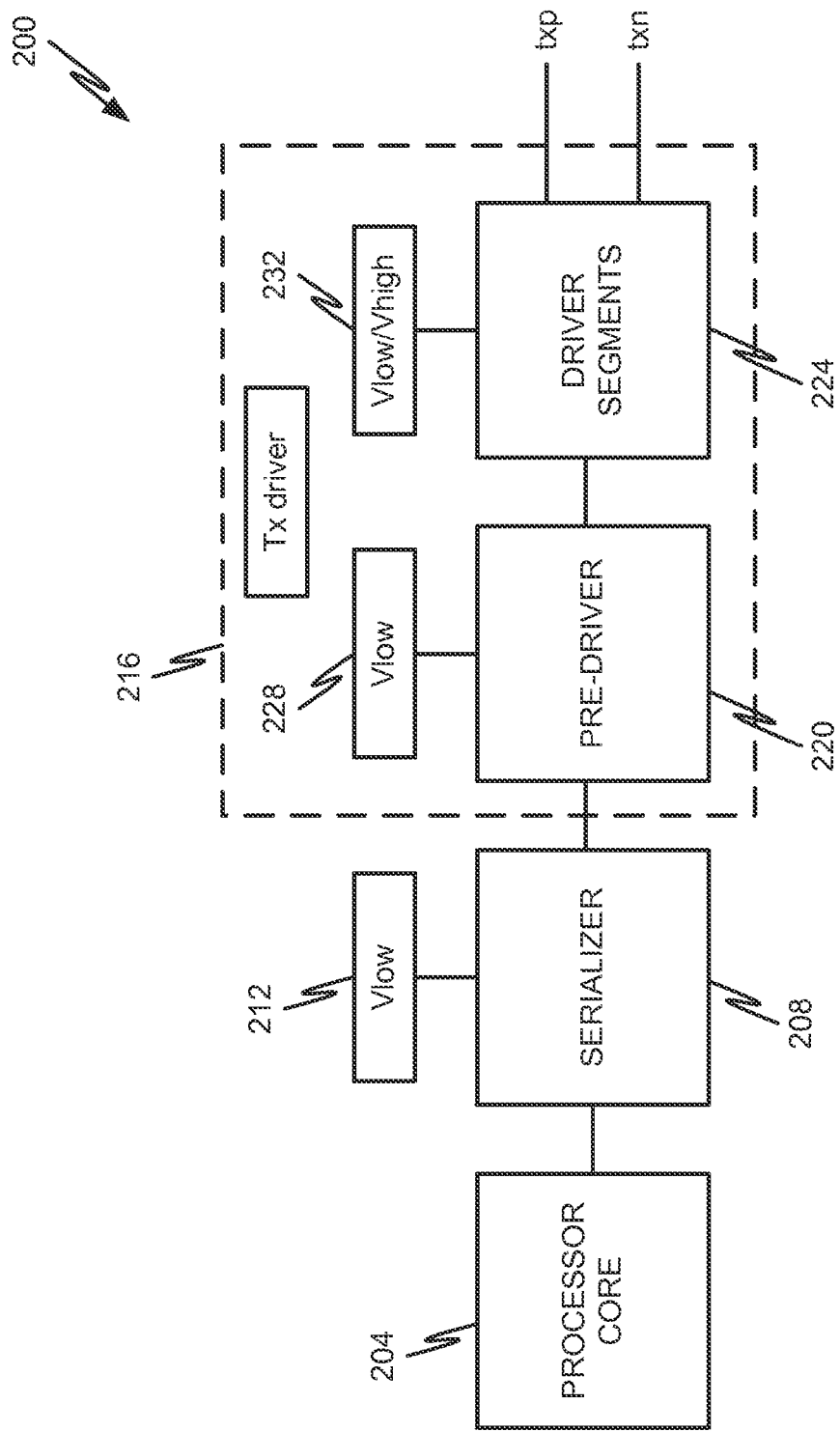
FIG. 2 is a block diagram depicting details of a transmitter in accordance with embodiments of the present disclosure.

Referring now to FIG. 2, additional details of a transmitter system 200 will be described in accordance with at least some embodiments of the present disclosure. The transmitter system 200 may correspond or be similar to transmitter 108. In some embodiments, the transmitter system 200 includes a processor core 204, a serializer 208, and a driver 216. The driver 216 is show to include a pre-driver 220 as well as one or more driver segments 224. Although the components 204, 208, 220, 224 are shown as being a part of a common transmitter system 200, it should be appreciated that the components 204, 208, 220, 224 can be included in different physical components. The output of the driver segments 224 include a first and second data channel that carry serialized data generated by the driver segment(s) 224. In the depicted embodiment, the two outputs include a txp and txn output. The transmitter system 200 may be capable of supporting up to 1.0V of different peak-to-peak voltage between the first data channel txp and the second data channel txn.

Advantageously, the serializer 208 and pre-driver components 220 are driven by low power supplies 212, 228, which may be on the order of 0.85V to 1.0V. Meanwhile the driver segment(s) 124 are capable of being partially driven by low power supplies and minimally driven by high power supplies 232. Because the serializer 208, pre-driver 220, and most of the components in the driver segment(s) 224 are driven by low power 212, 228 as opposed to high power supplies, which may be on the order of 1.0V to 1.2V. Most SerDes transmitters of the prior art require that the driver segments and pre-driver entirely be driven by high power supplies. Moreover, conventional SerDes transmitters required the user of a level shifter between the serializer and pre-driver to assist with the signal shift from the low voltage to the high voltage without inducing jitter and other sources of noise. The transmitter system 200 of the present disclosure, on the other hand, does not need the use of a level shifter as the driver segment(s) 224 are at least partially driven by the low voltage supply.

Figure 3:
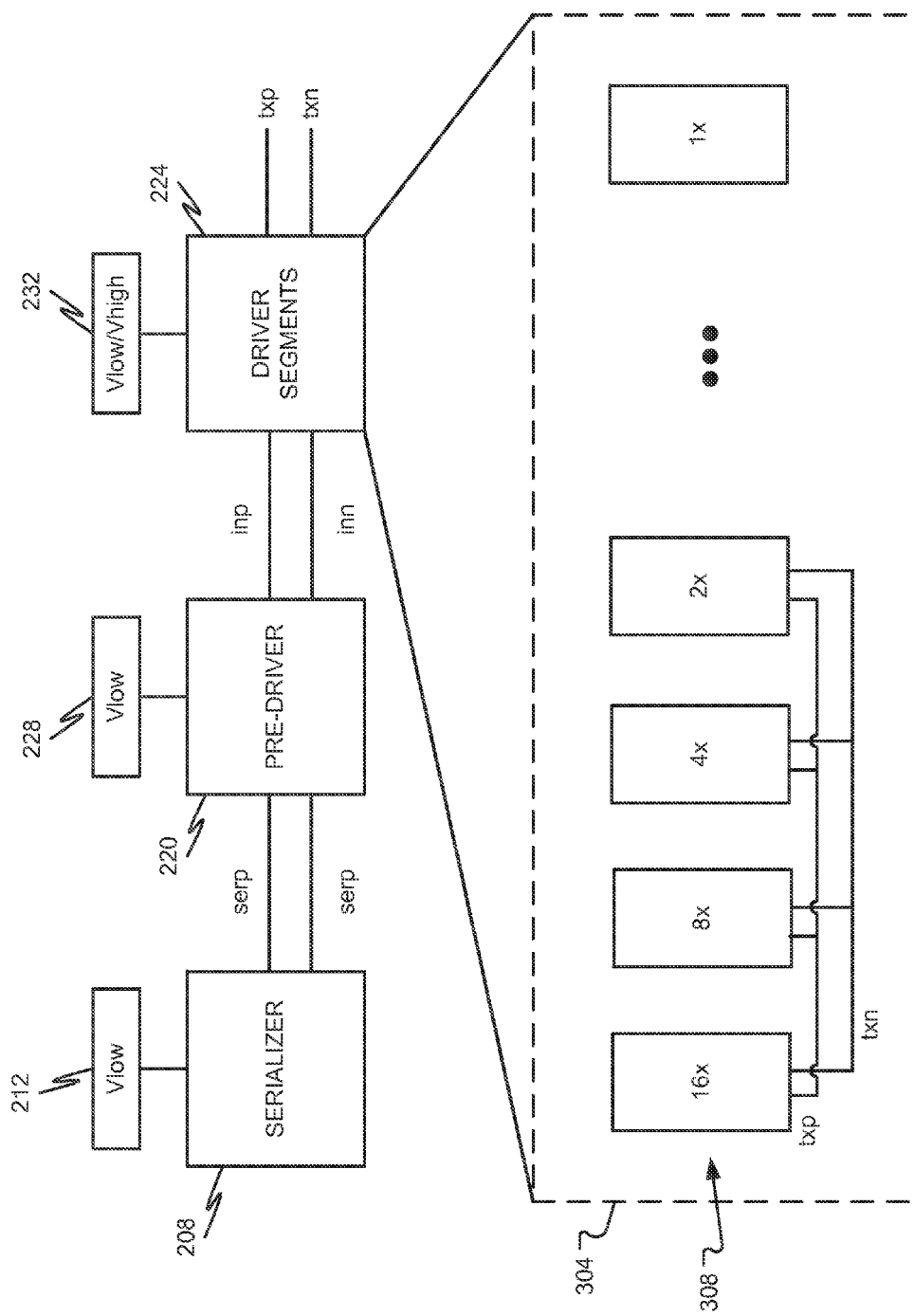
FIG. 3 is a block diagram depicting details of transmitter driver segments in accordance with embodiments of the present disclosure.

As can be seen in FIG. 3, additional details of the driver segment(s) 224 are shown. In particular, the driver segment(s) 224 may include a plurality of driver segments 304 where each segment 308 in the plurality of driver segments 304 is weighted and has at least two nodes that are tied individually to one another. This particular construction of the plurality of driver segments 304 enables a flexibility in transmitter design for different transmitter applications. Furthermore, the various weighted transmitter segments 308 may have their resistances weighted from 1 to 68 or more. In some embodiments, the driver segment(s) 224 are composed of differently weighted segments 308, each of which contributes to transmission of a signal across the output channels txp, txn.

Figure 4:
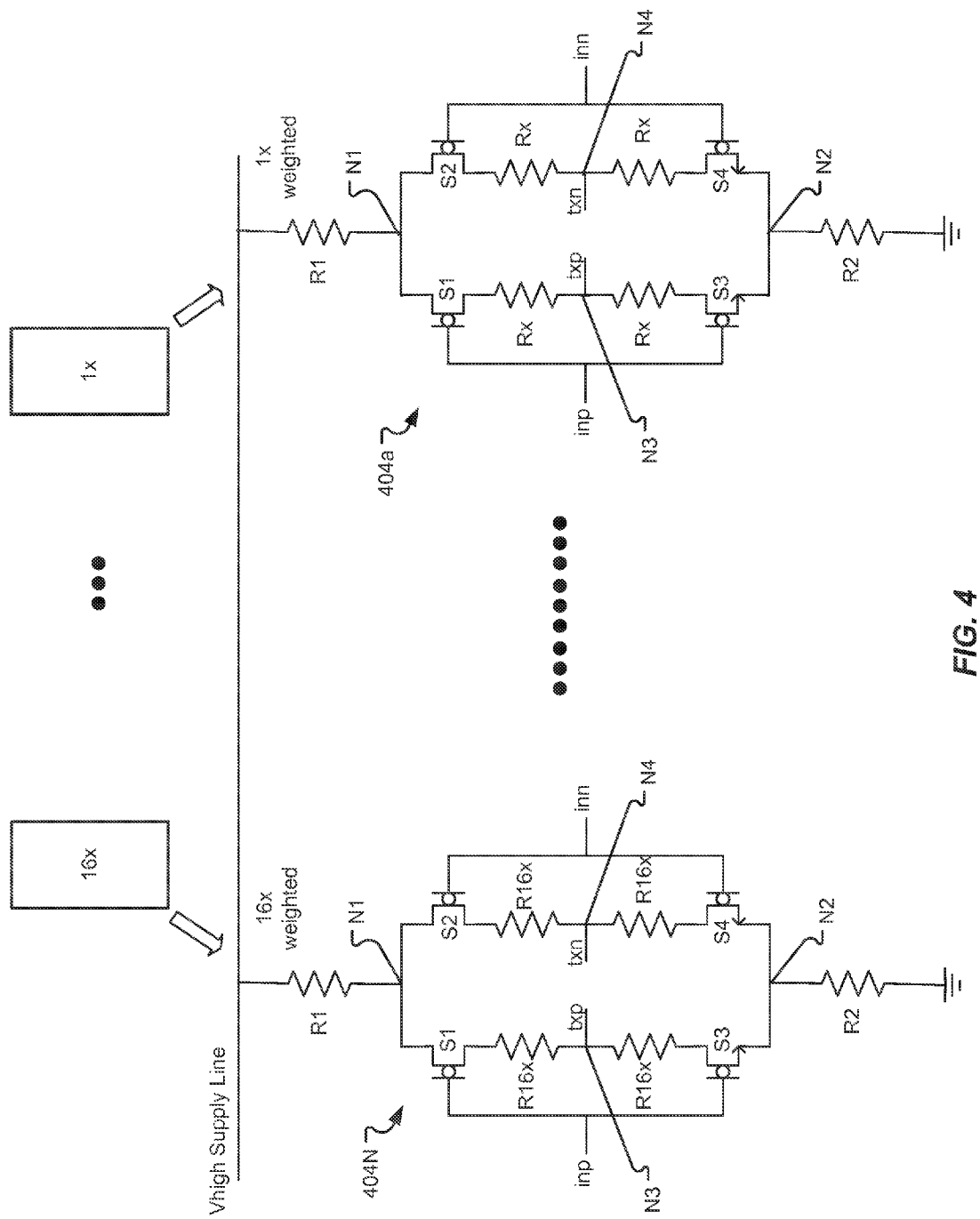
FIG. 4 is a circuit diagram depicting illustrative circuits that can be used to construct transmitter driver segments in accordance with embodiments of the present disclosure.

Additional details of the plurality of weighted segments 404a-N are shown in FIG. 4 where it can be seen that the circuit of each weighted segment 404a-N is connected to a common high voltage supply line Vhigh. The weighted segments 404a-N may correspond to specific variants of the segments 308, but should not be construed as the only mechanism for achieving the segments 308.

In the depicted embodiment, each of the weighted set of segments 404a-N have a P-channel Metal Oxide Semiconductor Field-Effect Transistor (PMOS) side (e.g., top half of circuit between Vhigh supply line and a line drawn through inputs inp, inn) as well as an N-channel MOSFET (NMOS) side (e.g., bottom half of circuit between the reference node/ground and a line drawn through inputs inp, inn). In the event that the driver segment(s) 224 are desired to only include a single segment, then only the first weighted segment 404a may be necessary for the driver segment 224. On the other hand, if a plurality of driver segments 224 are desired, then a plurality of weighted segments 404a-N may be connected to one another. One advantage to using the configuration of the weighted segments 404 depicted herein is that each of the inputs to the logic components (e.g., inputs inn and inp) are on the low voltage domain. This alleviates the need for a level shifter in addition to reducing the overall power consumed by the transmitter driver 216.

As can be seen in FIG. 4, each weighted segment 404 includes two or more logic components (e.g., PMOS transistors S1, S2) on the PMOS side and two or more logic components (e.g., NMOS transistors S3, S4) on the NMOS side. The pair of PMOS transistors S1, S2 on the PMOS side each have a source node connected to a first shared node N1. The first shared node N1 is separated from the high voltage source (e.g., Vhigh supply line) by a first resistor R1. The first resistor R1 may be referred to herein as a degeneration resistor or split degeneration resistor as it helps degenerate the high voltage source to a level that is approximately equal to the low voltage (e.g., inputs inp, inn) at which the other logic components of the circuit are driven.

The first PMOS transistor S1 receives the first input inp from the pre-driver 220 at its gate. In some embodiments, the first input inp is a low voltage input and is on the order of 0.85V to 1.0V. The drain of the first PMOS transistor S1 is connected to a first drive resistor Rx, which may be weighted depending upon which segment 404a-N it belongs to. For instance, the first drive resistor Rx in the first segment 404a may not be weighted at all and may have a nominal resistance of approximately 33 ohms. The first drive resistor R16x in the Nth segment 404N may be weighted by 16 times the first segment 404a, in which case the first drive resistor R16x may comprise a resistance that is sixteen times greater than the resistance of the first drive resistor Rx in the first segment 404a. The first drive resistor Rx carries current from the drain of the first PMOS transistor S1 to a first output node N3, which supplies the first portion of the serialized output txp.

The second PMOS transistor S2 receive the second input inn from the pre-driver 220 at its gate. In some embodiments, the second input inn is complimentary and opposite to the first input inp, meaning that the second input is 180 degrees out of phase with the first input and operating at approximately the same voltage levels as the first input (e.g., between 0.85V and 1.0V). The drain of the second PMOS transistor S2 is connected to a second drive resistor Rx, which may be weighted depending upon which segment 404a-N it belongs to. The second drive resistor Rx carries current from the drain of the second PMOS transistor S2 to a second output node N4, which supplies the second portion of the serialized output txn. The outputs txp, txn may then be serialized with one another for transmission across the communication channel 116.

Similar to the PMOS side, the pair of NMOS transistors S3, S4 on the NMOS side may each have a source node connected to a second shared node N2. The second shared node N2 is shown to be separated from a reference voltage or ground by a second resistor R2. In some embodiments, the resistance of the first and second resistors R1, R2 are approximately the same and can be on the order of 10 ohms to 20 ohms for the transmitter system 200 operating at 14 GHz or more and having a high supply voltage around 1.2V.

The first NMOS transistor S3 (which may also be referred to as a third logic component) is shown to receive the same input as is provided to the first PMOS transistor S1. The second NMOS transistor S4 (which may also be referred to as a fourth logic component) is shown to receive the same input as is provided to the second PMOS transistor S2. The drain of the first NMOS transistor S3 is connected to the first output node N3 via a third drive resistor Rx, that is approximately the same size as the other drive resistors in the circuit. Likewise, the second NMOS transistor S4 is connected to the second output node N4 via a fourth drive resistor Rx, that is approximately the same size as the other drive resistors in the circuit.

By enabling each of the logic components S1, S2, S3, S4 to receive low voltage inputs at their gates, the power consumption of the overall segment 404a-N is reduced as compared to a scenario where each of the logic components are receiving high voltage inputs. Accordingly, the first and second resistors R1, R2 enable reduced power consumption for the overall circuit and help to avoid the need for a level shifter in the transmitter system 200. In other words, the first and second resistors R1, R2 provide a voltage drop from the high voltage supply that approximates a voltage input to the gates of the logic components S1, S2, S3, S4. The drive resistors also help to protect the logic components S1, S2, S3, S4 from electrostatic discharge.

Figure 5:
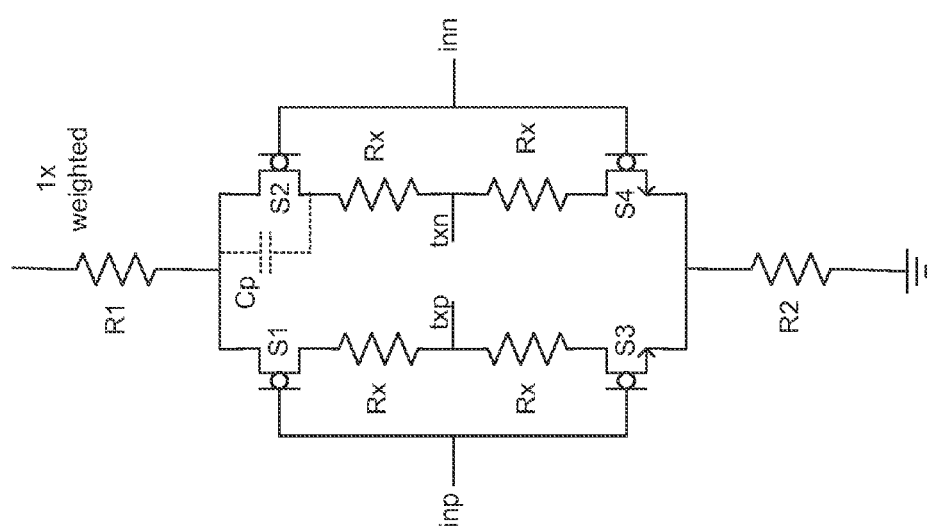
FIG. 5 is a circuit diagram depicting additional details of a transmitter driver segment in accordance with embodiments of the present disclosure.

Because of the configuration of the driver segments 224 depicted herein, each segment 404 can behave like a different cell. Every segment 404 has its source tied at local levels (e.g., Vhigh supply voltage). This global node connection impacts the amplitude/step size as well as non-linearity/common mode noise. In particular, as can be seen in FIG. 5, parasitic capacitance Cp can exist between the first common node N1 and the drain of a PMOS transistor (e.g., S1 or S2). FIG. 5 shows a parasitic capacitance Cp existing between the first common node and the drain of the second logic component S2. The transmitter architecture suggested herein helps to limit this parasitic capacitance Cp within controlled levels.

The impact of the parasitic capacitance Cp at the first common node N1 impacts the bandwidth of the node as the voltage needs to settle within 1 UI (e.g., 28.5 ps for a transmitter operating at 28 Gbps). A very high capacitance dictates the voltage settling at the node. For a large number of 1 UI patterns, the voltage trends higher than the DC level of Vreg−IR. This is referred to as the common mode noise impact. However, the impact of the common mode noise is generally minimized due to the fact that the degeneration resistors R1, R2 help to drop the high voltage in front of the sources of the logic components S1, S2, S3, S4.

Figure 6:
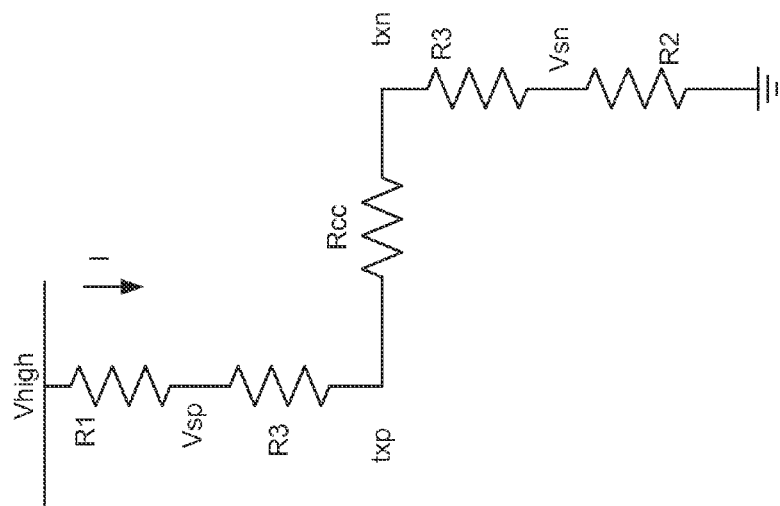
FIG. 6 is a circuit diagram depicting an equivalent circuit for the transmitter driver segment in accordance with embodiments of the present disclosure.

With reference now to FIG. 6, additional details of an equivalent circuit to the segments 404 shown in FIG. 4 will be described. In particular, the equivalent circuit shown in FIG. 6 is showing the split resistors and the features of implementing the same. The resistance between the input voltage and the first output txp may have its total resistance split among the first resistor (e.g., the degradation resistor) R1 and a third resistor (e.g., a drive resistor and internal resistance of the first logic component S1) R3. A communication channel resistance Rcc is also depicted as approximating the resistance of the communication channel 116. Similar to the first output, the second output txn may have a split resistance between itself and the reference node.

In some embodiments, the ratio of the split resistance R1:R3 may be approximately 0.33:0.66. For instance, if the Vhigh is approximately 1.15V or 1.2V and the communication channel resistance Rcc is approximately 100 ohms, then the split resistance for the first output (e.g., R1 and R3) may be approximately 50 ohms. The first resistor R1 may have a resistance of approximately 16.66 ohms (e.g., ⅓ of the whereas the third resistor R3 may have a resistance of approximately 33.33 ohms. Similar values may be applied for R2 and R3, meaning that the size of the second resistor R2 may be approximately equal to the size of the first resistor R1. It should be appreciated that the relatively larger size of the drive resistors helps to protect the logic components S1, S2, S3, S4 from electrostatic discharge. However, it is also desirable to keep Vsp and Vsn at relatively low levels to maintain low power consumption for the driver.

In this illustrative scenario, the current flowing through the equivalent circuit may be approximately 5.75 mA. This will result in a voltage at the first output txp to be approximately 0.86V while the voltage at the second output txn will be approximately 0.288 V. These voltages result in a differential peak-to-peak voltage of 1.15V, consistent with the high supply voltage. It should also be appreciated that the proposed transmitter architecture exhibits approximately the same return loss as conventional drivers; again, without needing a level shifter and with reduced power consumption.

Figure 7:
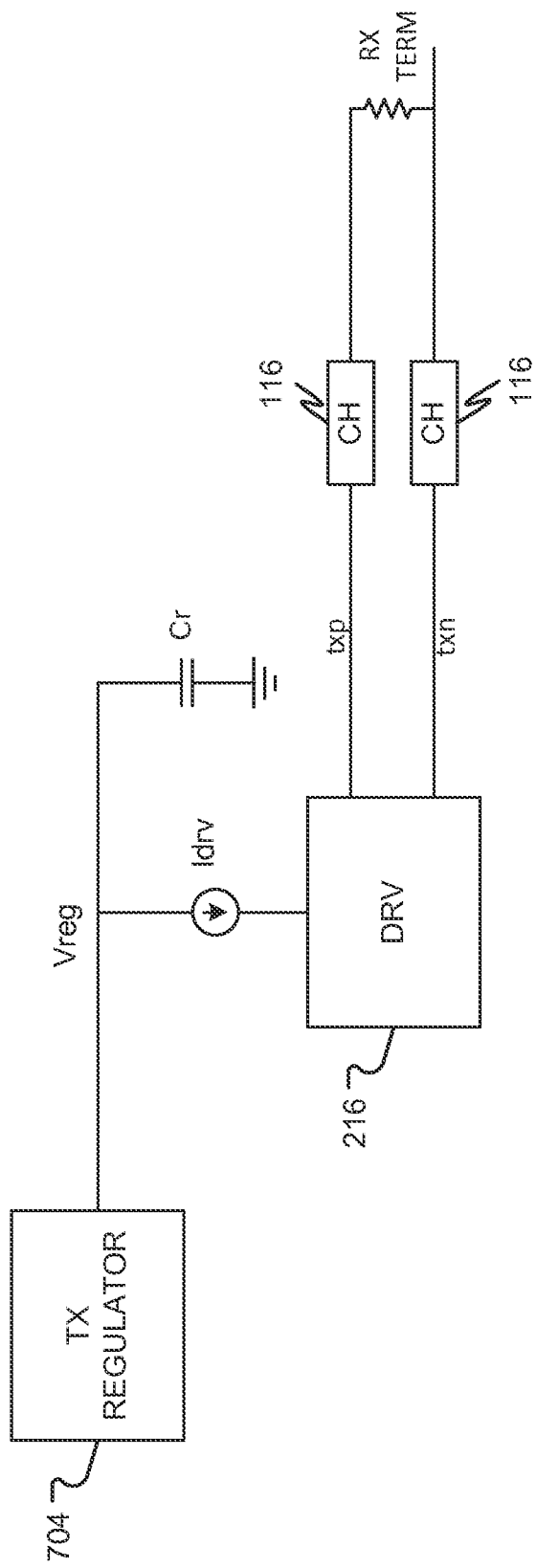
FIG. 7 is a block diagram depicting details of a transmitter regulator in accordance with embodiments of the present disclosure.

It is another aspect of the present disclosure to propose a mechanism for handling hot plug-in events as well as other device reliability concerns. With reference now to FIG. 7, details of a transmission regulator 704 will be described in accordance with at least some embodiments of the present disclosure. The transmission regulator 704 is shown to be connected to a regulator capacitance Cr, which can be on the order of 70 pF to 100 pF, or more specifically about 80 pF, when the regulator voltage Vreg is approximately 1.2V. When operating at these levels, the driver current may be approximately 6.0 mA. This voltage and current provided to the driver 216 and specifically to the driver segments 404 can be regulated by the transmission regulator 704 to help avoid damage to the logic components S1, S2, S3, S4 in each of the driver segments 404.

Figure 8:
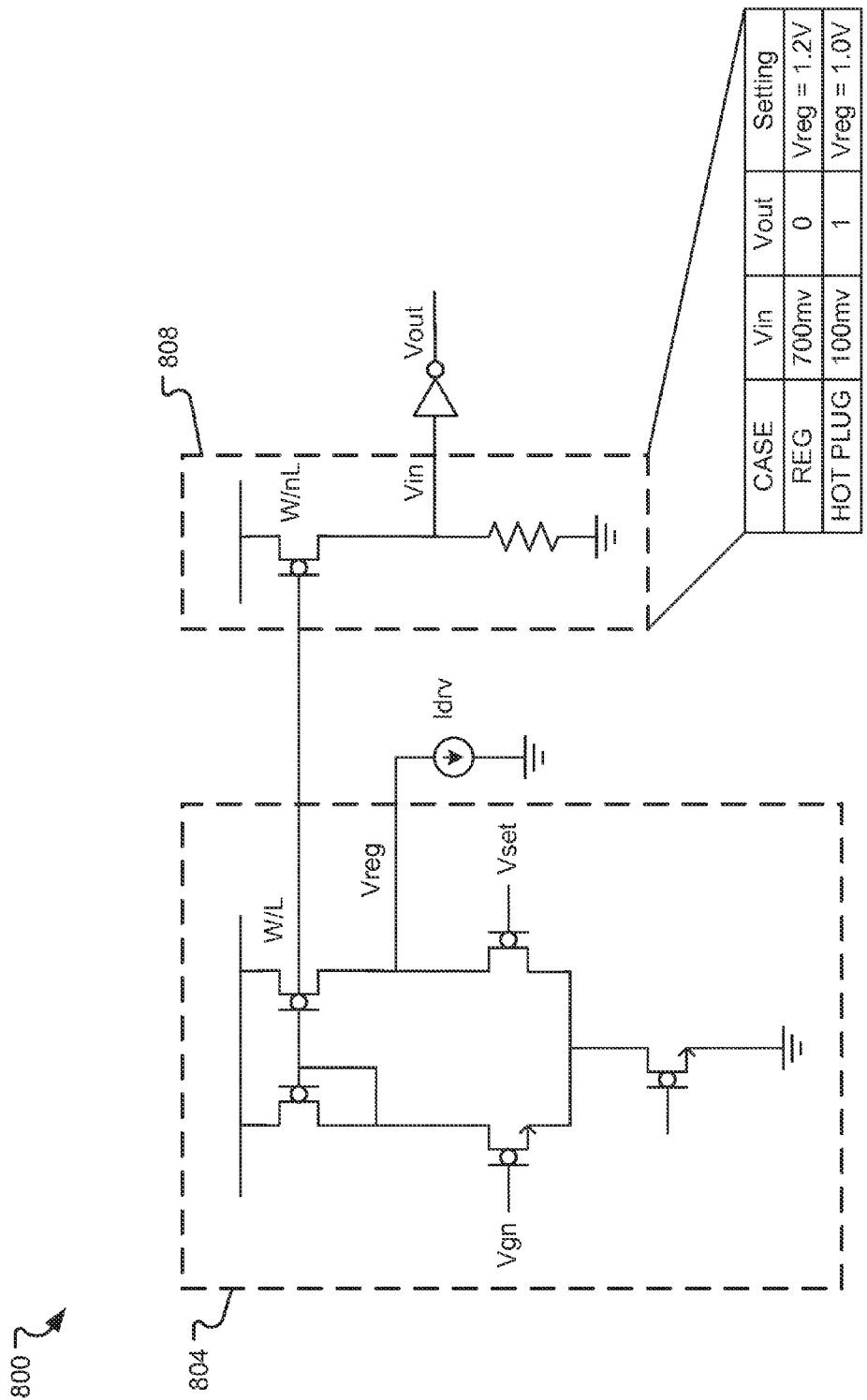
FIG. 8 is a circuit diagram depicting details of a regulator circuit in accordance with embodiments of the present disclosure.

FIG. 8 shows one specific, but non-limiting, example of a transmission regulator circuit 700 that can be implemented in accordance with at least some embodiments of the present disclosure. The regulator circuit 800 that can be incorporated into the transmission regulator 704 and is shown to include a plurality of logic components. The regulator circuit 800 is shown to include an amplifier section 804 and a hot-plug detection section 808. The amplifier section 804 includes a plurality of logic components that are used to regulate the voltage and current provided by the transmission regulator to the driver 216. In particular, the amplifier section 804 is connected to and controlled by the hot-plug detection section 808. In the event that the hot-plug detection circuit 808 detects normal or regular operating conditions, then the input voltage Vin is approximately 700 mV and the output voltage Vout is set to '0'. This causes the amplifier section 804 to produce a regulated voltage Vreg of approximately 1.2V and a regulated current of approximately 6 mA.

On the other hand, when the hot-plug detection section 808 detects a hot-plug condition, the input voltage will be approximately 100 mV and the output voltage will be set to '1'. This causes the amplifier section 804 to generate a regulated voltage Vreg of approximately 1.0V, thereby protecting the driver 216 and the components thereof from the voltage spikes traditionally encountered with a hot-plug condition.

In some embodiments, a hot-plug condition or event occurs when there is no connection to the receiver/Rx. The connection could be pulled out accidentally or sometimes for testing purposes. The problem with such an event is that the Tx port sees and open circuit. There is no current flowing through the transmitter devices. This means that there is zero current flowing through the degeneration resistor.

With no current flowing through the degeneration resistor, the PMOS source is at the Vhigh supply instead of the Vsupply−IR drop (Approximately low supply). Such an event causes device overstress and increases chances of Oxide breakdown.

To handle a hot-plug condition, embodiments of the present disclosure propose a feedback scheme where a switch mirroring the Regulator output voltage is employed. W/L is the size of the Regulator Amplifier switch whereas W/nL means that the mirrored current is a very small replica current. The idea of the small replica current is to help detect when the transmitter is in operation so that the regulated output can be approximately 1.2V.

If the logic built with the replica bias detects that there is no current through the transmitter (e.g., a hot-plug condition), then the logic sends a feedback to the regulator to lower the output voltage to approximately 1V. Vgn is the gate voltage of the regulator amplifier. The Vset is high or the low supply select based on the transmitter operation.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A transmitter driver, comprising:
one or more driver segments configured to generate a serialized output of a first signal and a second signal, the one or more driver segments including:
a first degeneration resistor connected between a high voltage source and a source of a first logic component, wherein the first degeneration resistor is configured to provide a voltage drop from the high voltage source to a low voltage that approximates a voltage input to a gate of the first logic component;
a second degeneration resistor connected between a reference node and a source of a second logic component, wherein the second degeneration resistor and the first degeneration resistor have approximately the same resistance, and wherein a gate of the second logic component receives the input signal;
a first drive resistor positioned between a drain of the first logic component and a first output node that outputs the first signal; and
a second drive resistor connected between a drain of the second logic component and the first output node.

2. The transmitter driver of claim 1, wherein a third logic component comprises a source connected to a common node with the source of the first logic component, wherein the third logic component comprises a gate that receives the an input signal that is complimentary and opposite to the input signal received at the gate of the first logic component, wherein a fourth logic component comprises a source connected to a common node with the source of the second logic component, wherein the fourth logic component comprises a gate that receives the same input signal received at the gate of the third logic component.

3. The transmitter driver of claim 2, wherein the one or more driver segments further include:
a third drive resistor positioned between a drain of the third logic component and a second output node that outputs the second signal; and
a fourth driver resistor positioned between a drain of the fourth logic component and the second output node.

4. The transmitter driver of claim 3, wherein the source of the first logic component and the source of the second logic component are individually tied to complimentary nodes of other driver segments in the one or more driver segments.

5. The transmitter driver of claim 3, wherein the first and third logic components comprise p-type transistors and wherein the second and fourth logic components comprise n-type transistors.

6. The transmitter driver of claim 5, wherein a parasitic capacitance exists between the source and drain of the first logic component.

7. The transmitter driver of claim 3, wherein current flowing through the first drive resistor and third drive resistor is approximately equal.

8. The transmitter driver of claim 1, wherein the one or more driver segments are weighted and have at least two nodes that are tied individually to one another.

9. The transmitter driver of claim 1, wherein first drive resistor protects the first logic component from electrostatic discharge.

10. The transmitter driver of claim 1, wherein the first logic component and the second logic component operate at a clock speed of at least 14 GHz.

11. A Serializer/Deserializer (SerDes) transmitter, comprising:
a serializer configured to receive input from core logic and serialize the received input for transmission to a pre-driver component, wherein the serializer operates at a first voltage;
a pre-driver component configured to receive a serialized input from the serializer without level-shifting the serialized input and condition the serialized input for transmission to one or more driver segments, wherein the pre-driver component also operates at the first voltage; and
one or more driver segments, each of the one or more driver segments comprising a first output and a second output configured to output a serialized first output signal and second output signal on a communication channel, wherein the first output signal and second output signal represent data received from the core logic, wherein each of the one or more driver segments comprises one or more degeneration resistors that enable logic components of the one or more driver segments to operate at the first voltage, and wherein each of the one or more driver segments comprises:
a first degeneration resistor connected between a high voltage source and a source of a first logic component, wherein the first degeneration resistor is configured to provide a voltage drop from the high voltage source the first voltage that approximates a voltage input to a gate of the first logic component;
a second degeneration resistor connected between a reference node and a source of a second logic component, wherein the second degeneration resistor and the first degeneration resistor have approximately the same resistance, and wherein a gate of the second logic component receives the input signal received at the gate of the first logic component;
a first drive resistor positioned between a drain of the first logic component and a first output node that outputs the first signal; and
a second drive resistor connected between a drain of the second logic component and the first output node.

12. The SerDes transmitter of claim 11, wherein each of the one or more driver segments further includes a third logic component and a fourth logic component, wherein the third logic component comprises a source connected to a common node with the source of the first logic component, wherein the third logic component comprises a gate that receives an input signal that is complimentary and opposite to the input signal received at the first logic component, wherein the fourth logic component comprises a source connected to a common node with the source of the second logic component, wherein the fourth logic component comprises a gate that receives the same input signal received at the gate of the third logic component.

13. The SerDes transmitter of claim 12, wherein each of the one or more driver segments further includes:
a third drive resistor positioned between a drain of the third logic component and a second output node that outputs the second signal; and
a fourth driver resistor positioned between a drain of the fourth logic component and the second output node.

14. The SerDes transmitter of claim 13, wherein the first and third logic components comprise p-type transistors and wherein the second and fourth logic components comprise n-type transistors.

15. The SerDes transmitter of claim 14, wherein a parasitic capacitance exists between the source and drain of the second logic component.

16. The SerDes transmitter of claim 11, wherein the reference node corresponds to a ground node.

17. A low power and low jitter transmitter circuit, comprising:
a P-channel Metal Oxide Semiconductor Field-Effect Transistor (PMOS) side comprising:
a pair of PMOS transistors each having a source connected to a first node, wherein the first node is separated from a high voltage source by a first degeneration resistor, wherein each of the PMOS transistors comprise a gate driven by an input signal, wherein a first of the PMOS transistors is driven by a first input signal and comprises a drain connected to a first output by a first drive resistor, wherein a second of the PMOS transistors is driven by a second input signal that is complimentary and opposite to the first input signal and comprises a drain connected to a second output by a third drive resistor, and wherein the first output generates a first signal for a serialized output and the second output generates a second signal for the serialized output; and
an N-channel MOSFET (NMOS) side comprising:
a pair of NMOS transistors each having a source connected to a second node, wherein the second node is separated from a reference node by a second degeneration resistor, wherein a first of the NMOS transistors is driven by the first input signal and comprises a drain connected to the first output by a second drive resistor, wherein a second of the NMOS transistors is driven by the second input signal and comprises a drain connected to the second output by a fourth drive resistor, and wherein the PMOS side and NMOS side operate at a clock speed of at least 14 GHz.

18. The circuit of claim 17, wherein the first degeneration resistor and second degeneration resistor have approximately the same resistance.

19. The circuit of claim 17, wherein a parasitic capacitance is provided across the first of the NMOS transistors.

20. The circuit of claim 17, wherein the first node operates at a voltage that is at least approximately 0.2V less than the high voltage source.

* * * * *